United States Patent
Peng et al.

(10) Patent No.: US 9,876,117 B2
(45) Date of Patent: *Jan. 23, 2018

(54) STRUCTURE AND FORMATION METHOD OF SEMICONDUCTOR DEVICE STRUCTURE

(71) Applicant: TAIWAN SEMICONDUCTOR MANUFACTURING CO., LTD., Hsinchu (TW)

(72) Inventors: Cheng-Yi Peng, Taipei (TW); Chih-Chieh Yeh, Taipei (TW); Hung-Li Chiang, Taipei (TW); Hung-Ming Chen, Zhubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/478,758

(22) Filed: Apr. 4, 2017

(65) Prior Publication Data
US 2017/0207339 A1    Jul. 20, 2017

Related U.S. Application Data

(63) Continuation of application No. 14/840,904, filed on Aug. 31, 2015, now Pat. No. 9,660,025.

(51) Int. Cl.
*H01L 29/66* (2006.01)
*H01L 21/70* (2006.01)
(Continued)

(52) U.S. Cl.
CPC ........ *H01L 29/7853* (2013.01); *H01L 21/322* (2013.01); *H01L 21/324* (2013.01);
(Continued)

(58) Field of Classification Search
None
See application file for complete search history.

(56) References Cited

U.S. PATENT DOCUMENTS

2005/0263795 A1    12/2005   Choi et al.
2007/0221926 A1    9/2007    Lee et al.
(Continued)

FOREIGN PATENT DOCUMENTS

TW    201110352 A1    3/2011
TW    201301508 A1    1/2013
(Continued)

*Primary Examiner* — Calvin Choi
(74) *Attorney, Agent, or Firm* — Birch, Stewart, Kolasch & Birch, LLP

(57) ABSTRACT

Structures and formation methods of a semiconductor device structure are provided. The semiconductor device structure includes a fin structure over a semiconductor substrate. An upper portion of the fin structure includes a first surface and a second surface which is inclined to the first surface. The semiconductor device structure also includes an isolation feature surrounding a lower portion of the fin structure. The semiconductor device structure further includes a passivation layer covering the first surface and the second surface of the upper portion. The passivation layer includes a semiconductor material and has a substantially uniform thickness. In addition, the semiconductor device structure includes an interfacial layer over the passivation layer. The interfacial layer includes the semiconductor material. The interfacial layer has a first portion covering the fin structure and a second portion covering the isolation feature. The passivation layer separates the fin structure from the interfacial layer.

20 Claims, 9 Drawing Sheets

(51) Int. Cl.
*H01L 29/06* (2006.01)
*H01L 21/3205* (2006.01)
*H01L 21/4763* (2006.01)
*H01L 29/78* (2006.01)
*H01L 23/31* (2006.01)
*H01L 21/324* (2006.01)
*H01L 21/322* (2006.01)
*H01L 27/088* (2006.01)
*H01L 21/8234* (2006.01)

(52) U.S. Cl.
CPC .. *H01L 21/823431* (2013.01); *H01L 23/3171* (2013.01); *H01L 27/0886* (2013.01); *H01L 29/0649* (2013.01); *H01L 29/0657* (2013.01); *H01L 29/66795* (2013.01)

(56) References Cited

U.S. PATENT DOCUMENTS

| | | |
|---|---|---|
| 2012/0267628 A1 | 10/2012 | Koike et al. |
| 2013/0075833 A1 | 3/2013 | Liu et al. |
| 2013/0307047 A1 | 11/2013 | Sakuma et al. |
| 2014/0138781 A1 | 5/2014 | Callegari et al. |
| 2014/0213037 A1 | 7/2014 | LiCausi et al. |
| 2015/0236123 A1 | 8/2015 | Chang et al. |
| 2015/0249130 A1 | 9/2015 | Jeong et al. |

FOREIGN PATENT DOCUMENTS

| | | |
|---|---|---|
| TW | 201334119 A1 | 8/2013 |
| TW | 201515116 A | 4/2015 |

STRUCTURE AND FORMATION METHOD OF SEMICONDUCTOR DEVICE STRUCTURE

CROSS REFERENCE TO RELATED APPLICATIONS

This application is a Continuation application of U.S. patent application Ser. No. 14/840,904, filed on Aug. 31, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
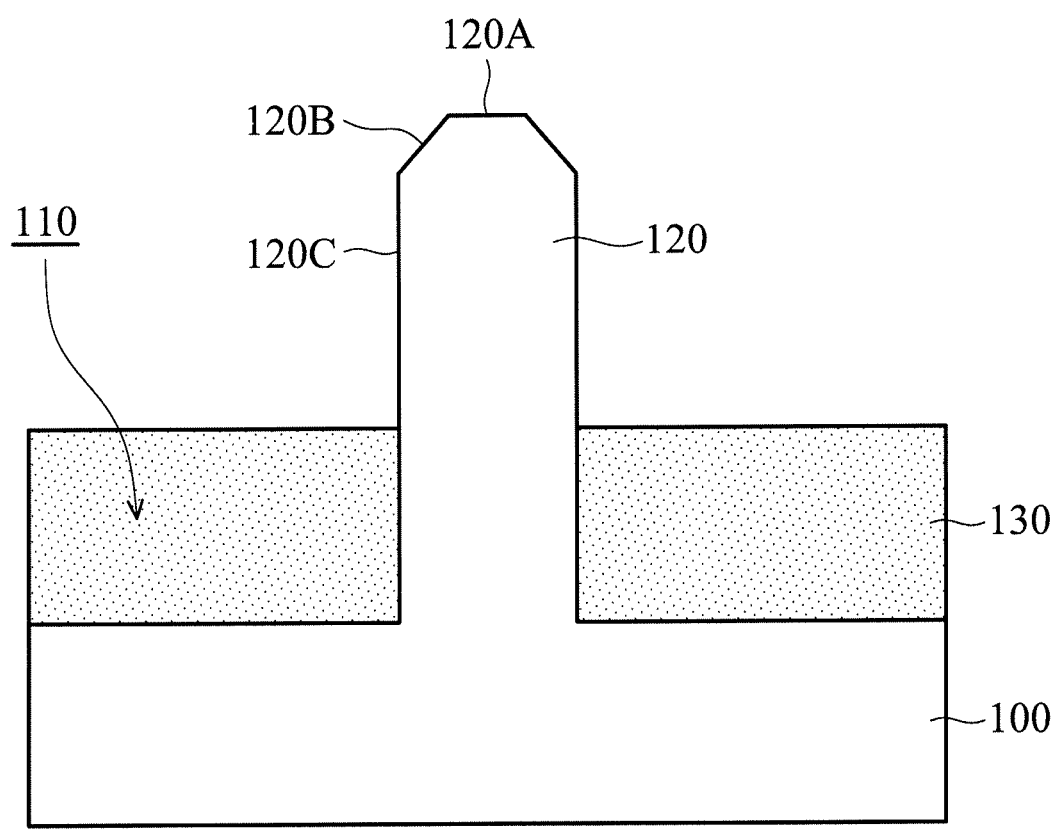
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1F are cross-sectional views of various stages of a process for forming a semiconductor device structure, in accordance with some embodiments. Additional operations can be provided before, during, and/or after the stages described in FIGS. 1A-1F. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, multiple recesses (or trenches) 110 are formed in the semiconductor substrate 100, in accordance with some embodiments. As a result, multiple fin structures 120 are formed between the recesses 110. As shown in FIG. 1A, one of the fin structures 120 is shown. In some embodiments, one or more photolithography and etching processes are used to form the recesses.

In some embodiments, the upper portion of the fin structures 120 is narrower than the lower portion of the fin structures 120. In some other embodiments, the upper portion of the fin structures 120 has substantially the same width as that of the lower portion of the fin structures 120.

In some embodiments, the fin structures 120 are made of a semiconductor material that is a compound semiconductor containing silicon and is not silicon. In some embodiments, the semiconductor substrate 100 includes a compound semiconductor, such as silicon germanium or silicon carbide. Accordingly, the fin structures 120 include a compound semiconductor containing silicon.

As shown in FIG. 1A, isolation features 130 are formed in the recesses 110 to surround lower portions of the fin structures 120, in accordance with some embodiments. The isolation features 130 are used to define and electrically isolate various device elements formed in and/or over the semiconductor substrate 100. In some embodiments, the isolation features 130 include shallow trench isolation (STI) features, local oxidation of silicon (LOCOS) features, another suitable isolation feature, or a combination thereof.

In some embodiments, each of the isolation features 130 has a multi-layer structure. In some embodiments, the isolation features 130 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 130. Similarly, the STI liner may also be used to reduce crystalline defects at the interface between the fin structures 120 and the isolation features 130.

In some embodiments, a dielectric material layer is deposited over the semiconductor substrate 100. The dielectric material layer covers the fin structures 120 and fills the recesses 110 between the fin structures 120. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surfaces of the fin structures 120 are exposed. The planarization process may include a chemical mechanical polishing (CMP) process, a grinding process, an etching process, another applicable process, or a combination thereof. Afterwards, the dielectric material layer is etched back to form the isolation features 130. The fin structures 120 protrude from the isolation features 130 and have an exposed upper portion, as shown in FIG. 1A in accordance with some embodiments.

In some embodiments, the top of the exposed upper portion of the fin structures 120 is narrower than the bottom of the exposed upper portion of the fin structures 120. In some other embodiments, the top of the exposed upper portion of the fin structures 120 has substantially the same width as that of the bottom of the exposed upper portion of the fin structures 120.

The exposed upper portion of the fin structures 120 includes three different surfaces 120A, 120B, and 120C, as shown in FIG. 1A in accordance with some embodiments. In some embodiments, the surface 120B is inclined to and adjoins the surface (i.e., the top surface) 120A. In some embodiments, the surface 120B is inclined to and adjoins the surface (i.e., the side surface) 120C. In some embodiments, the surface 120A is substantially perpendicular to the surface 120C. In some other embodiments, the surface 120A is inclined to the surface 120C. In some embodiments, the exposed upper portion of the fin structures 120 gradually becomes wider along the surface 120B from the surface 120A towards the surface 120C.

In accordance with some embodiments, the surfaces of the exposed upper portion of the fin structures 120 include three different crystal orientations. For example, the surfaces 120A, 120B, and 120C have {001}, {111}, and {110} crystal orientations, respectively. In some other embodiments, the surfaces of the exposed upper portion of the fin structures 120 include two different crystal orientations. For example, the top surface 120A and the side surfaces 120B have {001} and {110} crystal orientations, respectively.

Figure 1B:
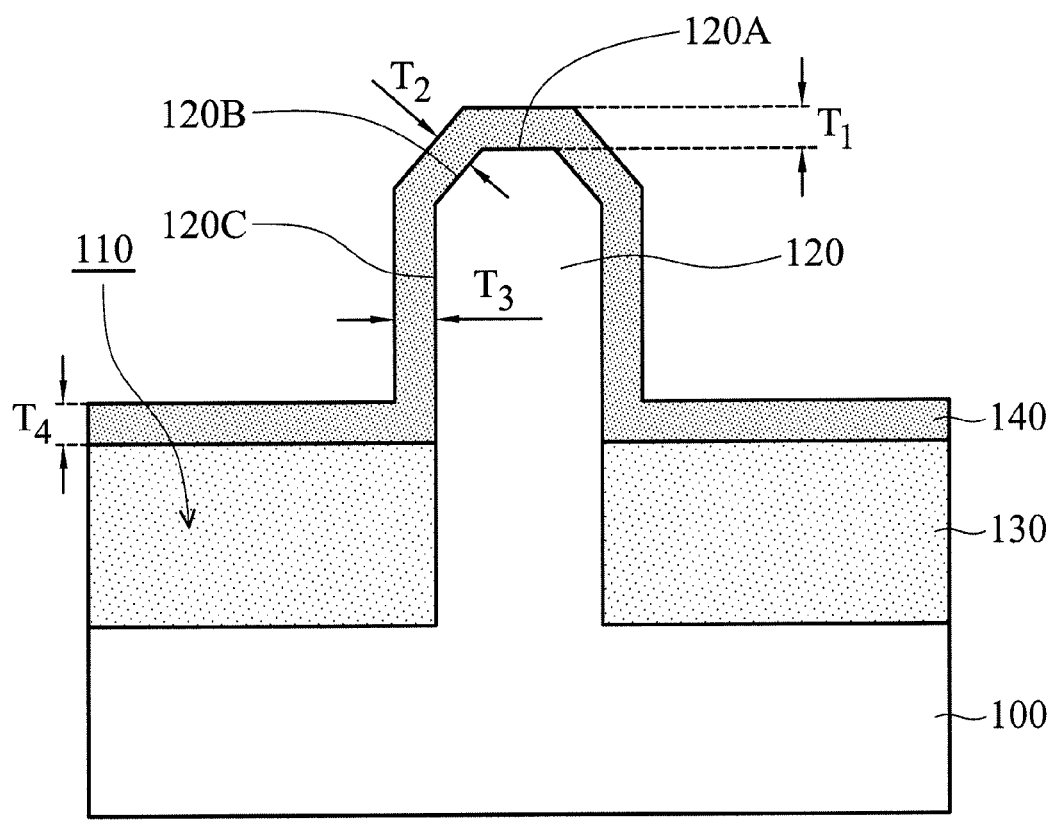

As shown in FIG. 1B, an interfacial layer (IL) 140 is deposited over the semiconductor substrate 100, in accordance with some embodiments. The interfacial layer 140 covers the isolation features 130 and the upper portion of the fin structures 120. In some embodiments, the interfacial layer 140 is configured to be positioned between the fin structures 120 and a subsequently formed gate dielectric layer. The interfacial layer 140 is used to form a high-quality interface with a low-density of defects and create a barrier against interfacial reactions and/or diffusion between a dielectric material and a semiconductor material.

In some embodiments, the interfacial layer 140 extends over the fin structures 120 and the isolation features 130 conformally. Various portions of the interfacial layer 140 covering the surface 120A, the surface 120B, the surface 120C, and the isolation features 130 have thicknesses $T_1$, $T_2$, $T_3$, and $T_4$, respectively. In some embodiments, the thicknesses $T_1$, $T_2$, $T_3$, and $T_4$ are substantially the same. In some other embodiments, some or all of the thicknesses $T_1$, $T_2$, $T_3$, and $T_4$ are different from each other.

In some embodiments, the interfacial layer 140 is made of oxide containing silicon or another suitable interfacial material. In some embodiments, the oxide containing silicon includes silicon oxide or another suitable oxide containing silicon. In some embodiments, the interfacial layer 140 is deposited using a CVD process, an atomic layer deposition (ALD) process, another applicable process, or a combination thereof.

A surface treatment of the fin structures 120 proceeds during the deposition of the interfacial layer 140, in accordance with some embodiments. In some embodiments, a hydrogen-containing precursor is used as one of the precursors (an oxidant source) for depositing the interfacial layer 140. In some embodiments, the hydrogen-containing precursor includes a $H_2O_2$ (aq) solution. The $H_2O_2$ (aq) solution may produce a vapor containing $H_2O_2$ (g) at room temperature. The upper portion of the fin structures 120 is exposed to $H_2O_2$ (g). As a result, multiple —OH bonds are adsorbed to or formed on the surfaces 120A, 120B, and 120C facing the interfacial layer 140. In some embodiments, the surfaces 120A, 120B, and 120C are referred to as $H_2O_2$ treated surfaces 120A, 120B, and 120C. Embodiments of the disclosure are not limited thereto. The surfaces 120A, 120B, and 120C may be treated to adsorb —OH bonds by another suitable way and/or at another stage.

Figure 1C:
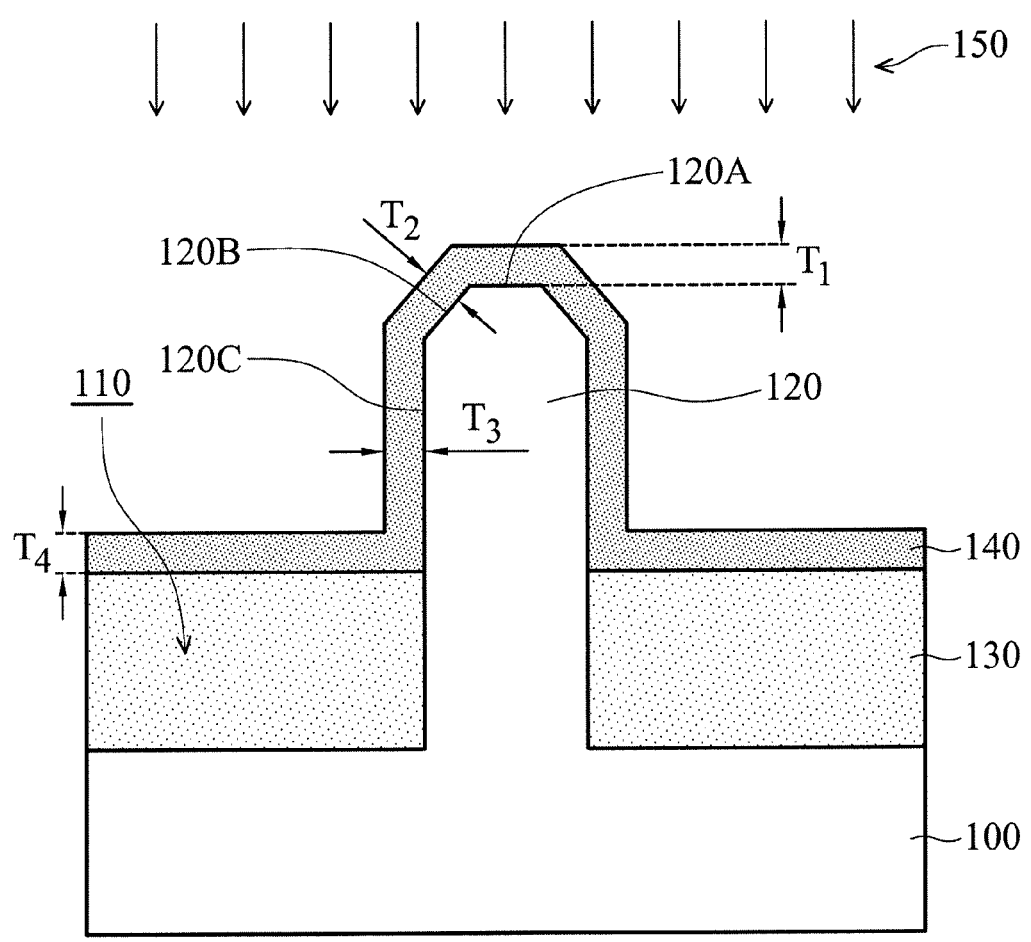

As shown in FIG. 1C, a surface treatment 150 is performed over the semiconductor substrate 100, in accordance with some embodiments. The surface treatment 150 provides the surfaces 120A, 120B, and 120C with —H bonds. As a result, the surfaces 120A, 120B, and 120C adsorb multiple —H bonds. The surface treatment 150 may be performed before the formation of the interfacial layer 140.

In some embodiments, the surface treatment 150 is performed over the $H_2O_2$ treated surfaces 120A, 120B, and 120C. As a result, the surfaces 120A, 120B, and 120C adsorb multiple —OH and —H bonds. The —H bonds may be provided in various ways. In some embodiments, the ways include performing a plasma process, feeding a hydrogen gas flow, performing an implantation process, or a combination thereof. Many variations and/or modifications can be made to embodiments of the disclosure. In some embodiments, the surface treatment 150 is performed before the formation of the interfacial layer 140. In some embodiments, —H bonds are adsorbed to or formed on the surfaces 120A, 120B, and 120C before the surfaces 120A, 120B, and 120C adsorb —OH bonds.

Figure 1D:
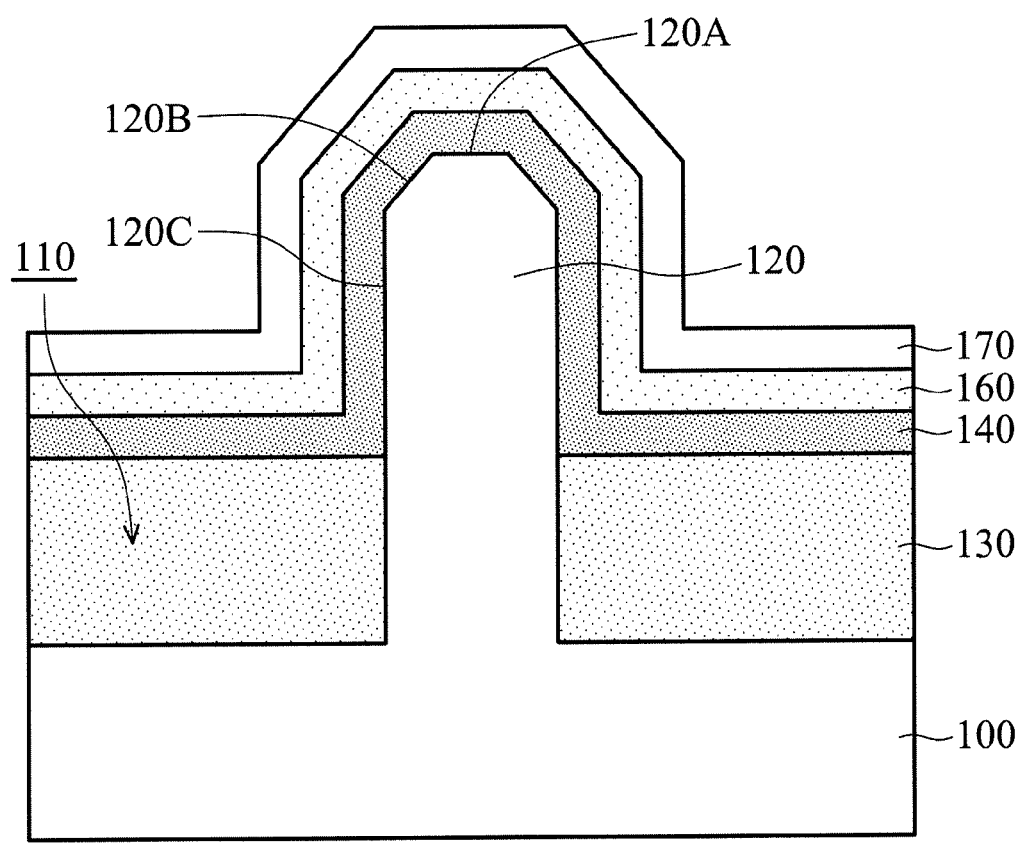

As shown in FIG. 1D, an oxygen scavenging layer 160 is deposited over the interfacial layer 140, in accordance with some embodiments. The oxygen scavenging layer 160 is configured to draw out oxygen of the oxide of the interfacial layer 140. In some embodiments, the oxygen scavenging layer 160 extends over the interfacial layer 140 conformally. In some embodiments, the oxygen scavenging layer 160 is thicker than the interfacial layer 140. In some embodiments, the oxygen scavenging layer 160 is thinner than the interfacial layer 140. In some other embodiments, the thickness of the oxygen scavenging layer 160 is substantially the same as the thickness $T_1$ of the interfacial layer 140.

In some embodiments, the oxygen scavenging layer 160 is made of an oxygen-deficient material. The oxygen-deficient material may include $SiO_x$ (1<x<2), $HfO_x$ (1<x<2), $Al_2O_x$ (2<x<3), $TiO_x$ (1<x<2), Ti, another suitable oxygen-deficient material, or a combination thereof. In some embodiments, the oxygen scavenging layer 160 is deposited using a CVD process, an ALD process, a spin-on process, another applicable process, or a combination thereof.

As shown in FIG. 1D, a barrier layer 170 is deposited over the oxygen scavenging layer 160, in accordance with some embodiments. The barrier layer 170 is used to substantially block the oxygen scavenging layer 160 from external oxygen during subsequent processes. The barrier layer 170 prevents the oxygen scavenging layer 160 from scavenging or reacting with oxygen that is not from the interfacial layer 140.

In some embodiments, the barrier layer 170 extends over the oxygen scavenging layer 160 conformally. In some embodiments, the thickness of the barrier layer 170 is greater than the thickness of the oxygen scavenging layer 160. In some other embodiments, the thickness of the barrier layer 170 is substantially the same as the thickness of the oxygen scavenging layer 160. In some embodiments, the thickness of the barrier layer 170 is greater than the thickness $T_1$ of the interfacial layer 140. In some other embodiments, the thickness of the barrier layer 170 is substantially the same as the thickness $T_1$ of the interfacial layer 140. In some embodiments, the thickness of the barrier layer 170 is in a range in a range from about 6 nm to about 10 nm.

In some embodiments, the barrier layer 170 includes multiple sub-layers, such as a first barrier layer and a second barrier layer, over the first barrier layer. The first barrier layer is positioned between the oxygen scavenging layer 160 and the second barrier layer. In some embodiments, the thickness of the first barrier layer is substantially the same as the thickness of the second barrier layer. In some other embodiments, the thickness of the first barrier layer is different from the thickness of the second barrier layer. The first barrier layer may be thicker than the second barrier layer.

In some embodiments, the first barrier layer and the second barrier layer are made of silicon, silicon nitride, another suitable barrier material, or a combination thereof. In some embodiments, the first barrier layer is made of silicon, and the second barrier layer is made of silicon nitride. One or more additional sub-layers can be added to the barrier layer 170. In some embodiments, the barrier layer 170 is deposited using a CVD process, another applicable process, or a combination thereof.

Figure 1E:
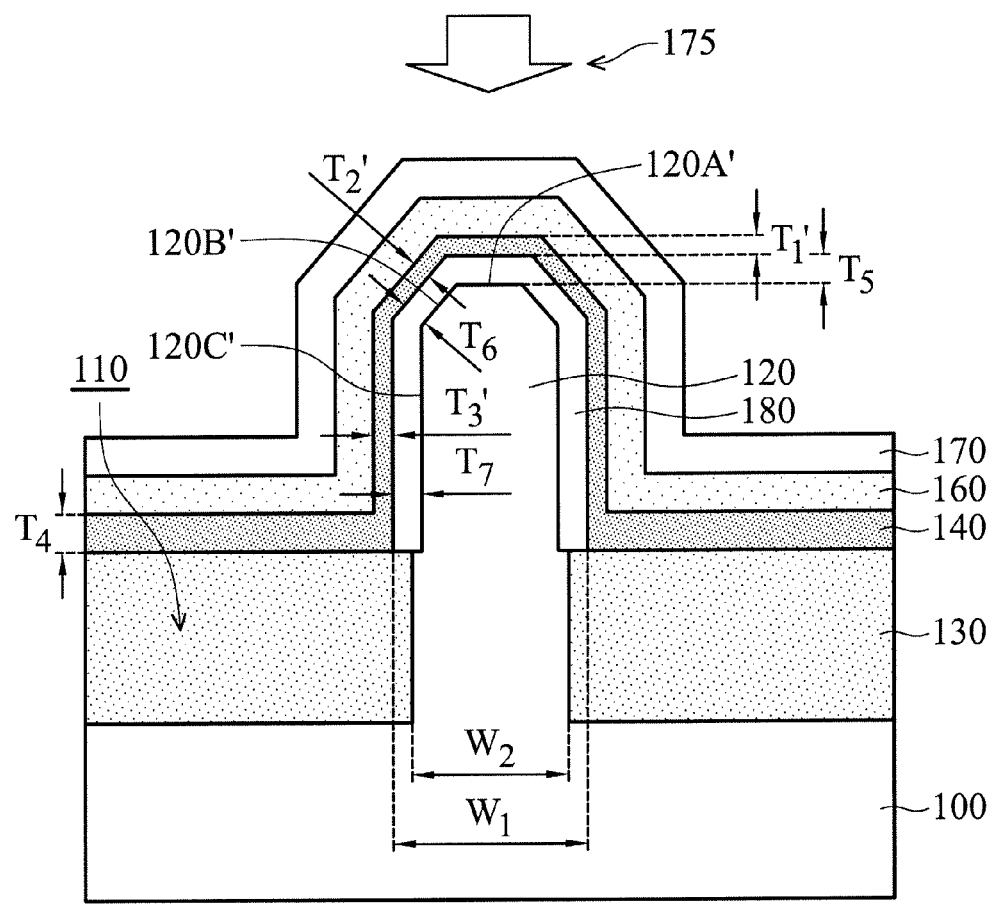

As shown in FIG. 1E, a thermal process 175 is performed such that a passivation layer 180 is formed over the fin structures 120, in accordance with some embodiments. The thermal process 175 includes a thermal annealing process. In some embodiments, the operation temperature for performing the thermal process 175 is in a range from about 250 degrees C. to about 900 degrees C. In some embodiments, the operation time for performing the thermal process 175 is in a range from about 150 seconds to about 240 seconds.

The passivation layer 180 may be used to passivate the fin structures 120 such that the device characteristics of the semiconductor device are enhanced. In some embodiments, the device characteristics includes an interface state density (Dit), a subthreshold swing (SS) value, a drain-induced barrier lowering (DIBL) value, or other device characteristics.

The passivation layer 180 covers and is in direct contact with the exposed upper portion of the fin structures 120, as shown in FIG. 1E in accordance with some embodiments. In some embodiments, the passivation layer 180 surrounds the upper portion of the fin structures 120 without surrounding the lower portion of the fin structures 120. In some embodiments, a total width $W_1$ of the passivation layer 180 and the upper portion of the fin structures 120 is greater than a width $W_2$ of the lower portion of the fin structures 120.

In some embodiments, the passivation layer 180 extends over the exposed upper portion of the fin structures 120 conformally. In some embodiments, the passivation layer 180 extends over the isolation features 130. In some embodiments, a surface profile of the passivation layer 180 is substantially the same as that of the upper portion of the fin structures 120. In some embodiments, the passivation layer 180 is positioned between the fin structures 120 and the oxygen scavenging layer 160. In some embodiments, the passivation layer 180 is positioned between the fin structures 120 and the interfacial layer 140.

In some embodiments, the thickness of the passivation layer 180 is in a range from about 5 Å to about 15 Å. In some embodiments, the passivation layer 180 has a substantially uniform thickness. The thickness uniformity of the passivation layer 180 is in a range from about ±0.8 Å to about ±1.2 Å. In some embodiments, the variety of capacitive effective thickness ($\Delta$CET) of the passivation layer 180 is in a range from about 0.26 Å to about 0.40 Å. In some embodiments, the passivation layer 180 includes single crystal silicon. In some other embodiments, the passivation layer 180 includes polysilicon.

In accordance with some embodiments, a reduction reaction proceeds in the interfacial layer 140 during the thermal process 175. In some embodiments, one or more portions of the silicon oxide in the interfacial layer 140 are reduced so that silicon elements and oxygen are separated from each other. The oxygen of the silicon oxide in the interfacial layer 140 is absorbed into the oxygen scavenging layer 160 during the thermal process 175. The silicon elements of the silicon oxide in the interfacial layer 140 are accumulated over the fin structures 120. As a result, the passivation layer 180 made of silicon is formed.

In some embodiments, one or more portions of the interfacial layer 140 are reduced and subsequently transformed to the passivation layer 180. In some embodiments, a lower portion of the interfacial layer 140 over the fin structures 120 is transformed to form the passivation layer 180 between the fin structures 120 and the interfacial layer 140 such that the lower portion of the interfacial layer 140 is recessed or retracted.

In some embodiments, the silicon oxide in the interfacial layer 140 is partially consumed as result of the reduction reaction and the oxygen absorption so that the interfacial layer 140 over the fin structures 120 is thinned, as shown in FIG. 1E. As a result, the passivation layer 180 is sandwiched between the fin structures 120 and the thinned interfacial layer 140, and is in direct contact with the thinned interfacial layer 140. In some other embodiments, the interfacial layer 140 over the fin structures 120 is consumed and disappears so that the passivation layer 180 is sandwiched between the fin structures 120 and the oxygen scavenging layer 160.

In some embodiments, the thicknesses $T_1$, $T_2$, and $T_3$ of the interfacial layer 140 are reduced to be the thicknesses $T_1'$, $T_2'$, and $T_3'$, as shown in FIG. 1E in accordance with some embodiments. In some embodiments, the reduced thicknesses $T_1'$, $T_2'$, and $T_3'$ are substantially the same. In some embodiments, the reduced thicknesses $T'_1$, $T_2'$, and $T_3'$ are less than the thickness $T_4$ of the interfacial layer 140.

As mentioned above, in some embodiments, —H bonds are attached to the surfaces 120A, 120B, and 120C of the fin structures 120. Due to the —H bonds, the aforementioned reduction reaction proceeds in one or more portions of the interfacial layer 140 adjacent to the surfaces 120A, 120B, and 120C. Accordingly, the —H bonds help ensure that the passivation layer 180 is in direct contact with the surfaces of the upper portion of the fin structures 120. In some embodiments, the reduction reaction proceeds at a temperature in a range from about 400 degrees C. to about 600 degrees C.

The oxygen scavenging layer 160, which includes an oxygen-deficient material before performing the thermal process 175, draws out the oxygen of the silicon oxide from the interfacial layer 140 during the thermal process 175. In some embodiments, one portion of the oxygen scavenging layer 160 reacts with the oxygen from the interfacial layer 140 and becomes a material containing more oxygen than another portion of the oxygen scavenging layer 160 after the thermal process 175. In some other embodiments, the oxygen scavenging layer 160 becomes a material containing more oxygen than the oxygen-deficient material after the thermal process 175. In some embodiments, the oxygen absorption proceeds at a temperature in a range from about 700 degrees C. to about 900 degrees C. In some embodiments, the reduction reaction proceeds later than the oxygen absorption.

In some embodiments, the barrier layer 170 prevents the oxygen scavenging layer 160 from reacting with oxygen that is not from the interfacial layer 140. Accordingly, the oxygen absorbed into the oxygen scavenging layer 160 during the thermal process 175 is substantially from the interfacial layer 140. In some embodiments, the oxygen scavenging layer 160 does not scavenge oxygen outside of the interfacial layer 140. Therefore, the barrier layer 170 assures the formation of the passivation layer 180.

In accordance with some embodiments, silicon atoms in the fin structures 120, which include a compound semiconductor containing silicon, are concentrated at the surfaces 120A, 120B, and 120C. As a result, a portion of the fin structures 120 is transformed to a further portion of the passivation layer 180. Accordingly, the passivation layer 180 is thickened and the upper portion of the fin structures 120 becomes narrower and shorter, as shown in FIG. 1E. In some other embodiments, the upper portion of the fin structures 120 does not become slim. In these cases, the fin structures 120 may not contain silicon.

In some embodiments, the thick passivation layer 180 is in direct contact with retracted surfaces 120A', 120B', and 120C' of the fin structures 120. In some embodiments, various portions of the passivation layer 180 covering the surfaces 120A', 120B', and 120C' have substantially the same thickness $T_5$, $T_6$, and $T_7$. In some other embodiments, the thickness $T_5$, $T_6$, and $T_7$ are slightly different. The difference between the thickness $T_5$, $T_6$, and $T_7$ is in a range from about +0.8 Å to about ±1.2 Å. In some embodiments, a surface profile of the passivation layer 180 is substantially the same as a total profile of the retracted surfaces 120A', 120B', and 120C'.

As mentioned above, in some embodiments, —OH bonds and/or —H bonds are attached to the surfaces 120A, 120B, and 120C of the fin structures 120. The —OH bonds and/or the —H bonds pull silicon atoms in the fin structures 120 to the surfaces 120A, 120B, and 120C during the thermal process 175. In some embodiments, the —H bonds pull the silicon atoms at a temperature in a range from about 250 degrees C. to about 900 degrees C. In some embodiments, the —OH bonds pull the silicon atoms at a temperature in a range from about 250 degrees C. to about 900 degrees C. In some embodiments, the attraction of the silicon atoms by the —OH and/or —H bonds proceeds later than the oxygen absorption. In some embodiments, the attraction of the silicon atoms by the —OH and/or —H bonds and the reduction reaction proceed simultaneously.

In some cases, a passivation layer made of silicon is deposited over a fin structure using an ultra-high vacuum CVD (UHVCVD) process, a molecular beam epitaxy (MBE) process, another applicable process, or a combination thereof. Moreover, the operation time for depositing the passivation layer is in a range from about 4 hours to about 5 hours.

In accordance with some embodiments, the passivation layer 180 is spontaneously formed over the fin structure 120 during the thermal process 175. In some embodiments, the operation time for forming the passivation layer 180 is in a range from about 150 seconds to about 240 seconds. Therefore, the fabrication cost and the fabrication time for forming the passivation layer 180 are significantly reduced.

In some cases, a passivation layer that is deposited over a fin structure using an UHVCVD process or a MBE process includes polysilicon or single crystal silicon. The passivation layer including polysilicon may unintentionally grow over other features (such as isolation features). In other words, the polysilicon is grown with poor selectivity. In contrast, the single crystal silicon may be grown with good selectivity. However, the growing rate of single crystal silicon over a {111} crystal orientation is less than that of single crystal silicon over {001} and {110} crystal orientations. As a result, there may be a thin passivation layer or even no passivation layer deposited over a surface of the fin structure.

In accordance with some embodiments, the passivation layer 180 is spontaneously formed during the thermal process 175 without an epitaxial growth process. As a result, the passivation layer 180 is formed with high selectivity and high uniformity. Specifically, the coverage of the passivation layer 180 over the fin structures 120 is greatly increased. The thicknesses $T_5$, $T_6$, and $T_7$ of the passivation layer 180 are substantially the same. Furthermore, the passivation layer 180 provides improved qualities (such as Dit, SS, and DIBL values). Therefore, the performance and reliability of the semiconductor device structure are significantly enhanced.

Figure 1F:
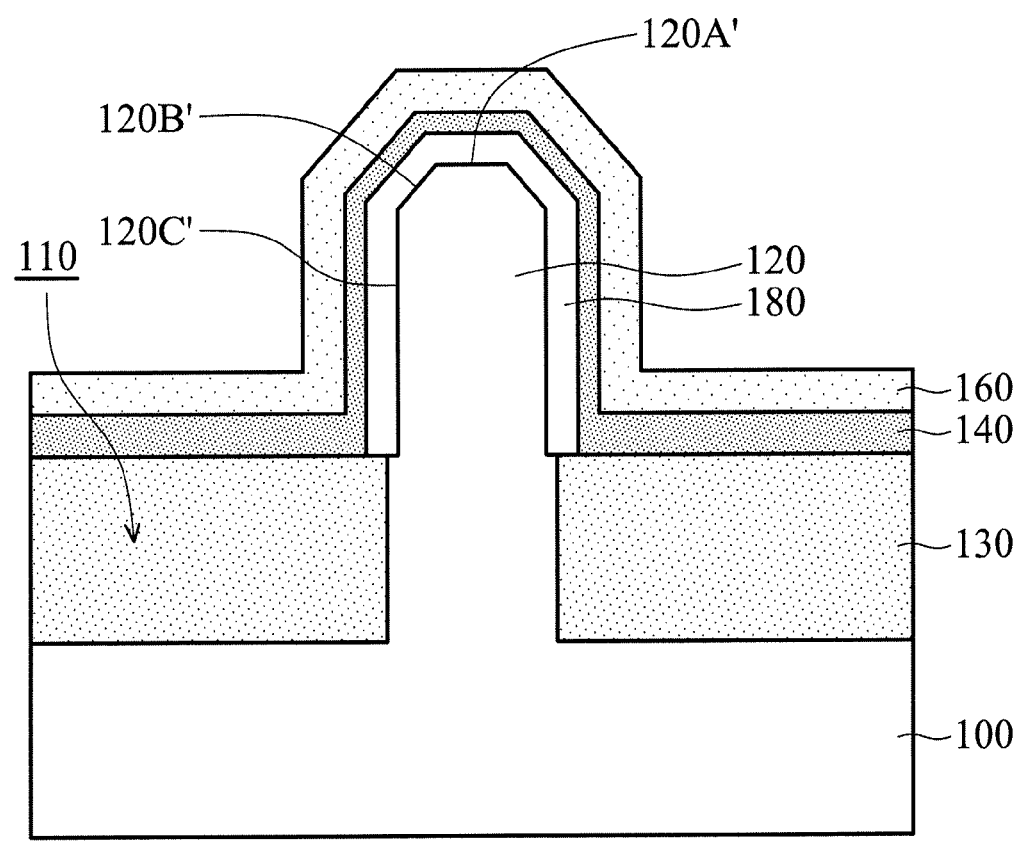

As shown in FIG. 1F, the barrier layer 170 is removed after the thermal process 175, in accordance with some embodiments. The oxygen scavenging layer 160 is exposed without being covered by the barrier layer 170. An etching process may be used to remove the barrier layer 170. In some embodiments, the oxygen scavenging layer 160 and the interfacial layer 140 are subsequently removed.

Afterwards, gate stacks are formed over the fin structures 120, in accordance with some embodiments. In some embodiments, each of the gate stacks includes a gate dielectric layer and a gate electrode. In some embodiments, the gate dielectric layer is made of silicon oxide, silicon nitride, silicon oxynitride, dielectric material with high dielectric constant (high-K), another suitable dielectric material, or a combination thereof. In some embodiments, the gate dielectric layer is a dummy gate dielectric layer which will be removed in a subsequent gate replacement process. The dummy gate dielectric layer is, for example, a silicon oxide layer.

In some embodiments, the gate electrode includes polysilicon, a metal material, another suitable conductive material, or a combination thereof. In some embodiments, the gate electrode is a dummy gate electrode and will be replaced with another conductive material, such as a metal material. The dummy gate electrode layer is made of, for example, polysilicon.

In some embodiments, each of the gate stacks further includes a hard mask over the gate electrode. The hard mask may serve as an etching mask during the formation of the gate electrode. The hard mask may also protect the gate electrode during subsequent processes. In some embodiments, the hard mask is made of silicon nitride, silicon oxynitride, silicon carbide, silicon oxide, silicon carbon nitride, another suitable material, or a combination thereof.

In accordance with some embodiments, the oxygen scavenging layer 160 serves as a gate dielectric material layer. The oxygen scavenging layer 160 may be replaced by another gate dielectric material layer. Afterwards, a gate electrode layer and a hard mask layer are sequentially deposited over the oxygen scavenging layer 160 (or another gate dielectric material layer). Each of the gate dielectric material layer, the gate electrode layer and the hard mask layer may be deposited using a CVD process, an ALD process, a physical vapor deposition process (PVD), another applicable process, or a combination thereof. A photolithography process and an etching process are performed to pattern the hard mask layer so as to form a hard mask. The interfacial layer 140, the oxygen scavenging layer 160 (or another gate dielectric material layer) and the gate electrode layer are etched through openings defined by the hard mask. As a result, multiple gate stacks are formed.

Subsequently, various features will be formed in the fin structures 120 or over the semiconductor substrate 100. Some of the various features are electrically connected to the gate stacks. The various features may include source/drain features, interconnection features and another suitable feature. Therefore, one or more fin field-effect transistors (FinFETs) are fabricated. The FinFETs include an N-type FinFET and a P-type FinFET.

Figure 2:
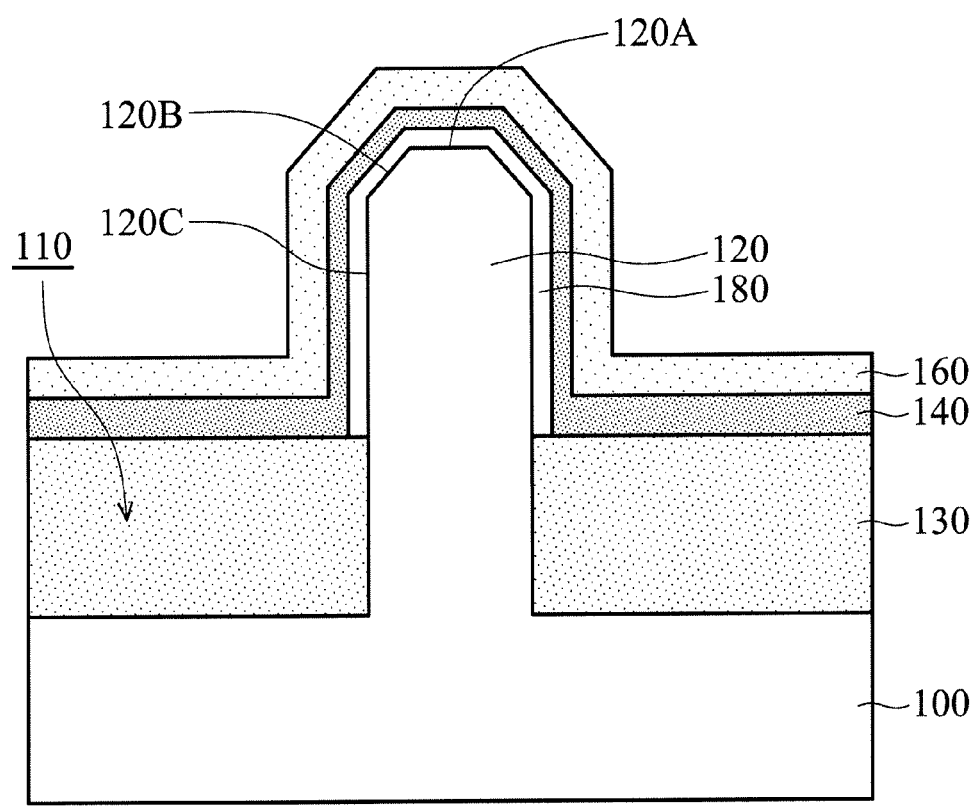
FIG. 2 is a cross-sectional view of a semiconductor device structure, in accordance with some embodiments.

Many variations and/or modifications can be made to embodiments of the disclosure. For example, the material of the fin structures may be varied. FIG. 2 is a cross-sectional view of a semiconductor device structure, in accordance with some embodiments. In some embodiments, the process for forming the semiconductor device structure shown in FIGS. 1A-1F can also be applied in the embodiments illustrated in FIG. 2. As shown in FIG. 2, a semiconductor device structure similar to that shown in FIG. 1F is provided, in accordance with some embodiments. The materials and/or formation methods of the semiconductor device structure are illustrated in the embodiments mentioned above and are not repeated.

In accordance with some embodiments, the fin structures 120 are made of an elementary semiconductor material (such as germanium) or a compound semiconductor without silicon (such as gallium arsenide, indium arsenide, indium phosphide or another suitable compound semiconductor). No silicon is provided by the fin structures 120 to form the passivation layer 180 during the thermal process 175. Therefore, as shown in FIG. 2, the upper portion of the fin structures 120 is not retracted.

In some embodiments, the passivation layer 180 is in direct contact with the surfaces 120A, 120B, and 120C. In some embodiments, a surface profile of the passivation layer 180 is substantially the same as a total profile of the surfaces 120A, 120B, and 120C. In some embodiments, the passivation layer 180 covering the surfaces 120A, 120B, and 120C has a substantially uniform thickness.

Figure 3A:
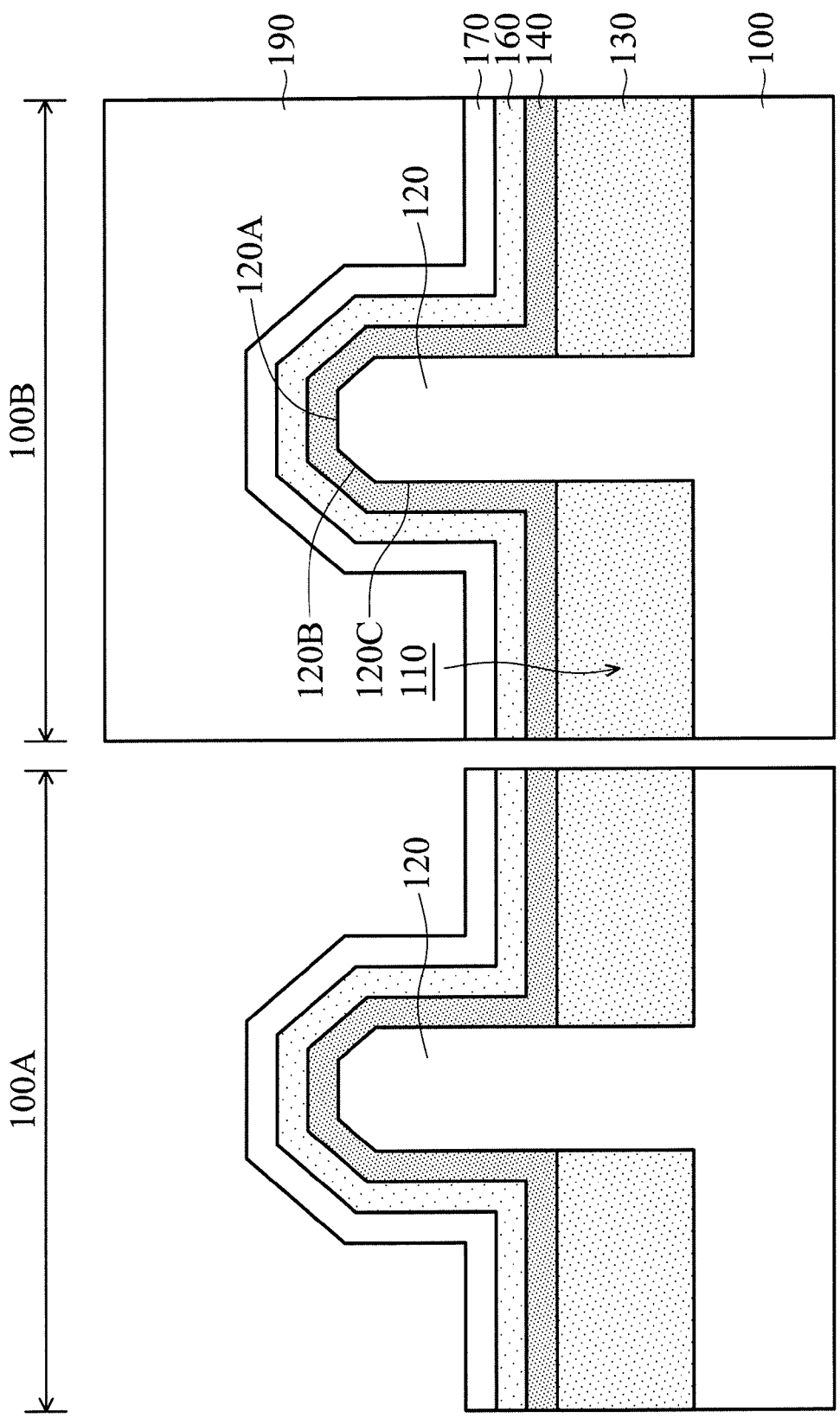
FIGS. 3A-3B are cross-sectional views of various stages of a process for forming a semiconductor device structure, in accordance with some embodiments.
Figure 3B:
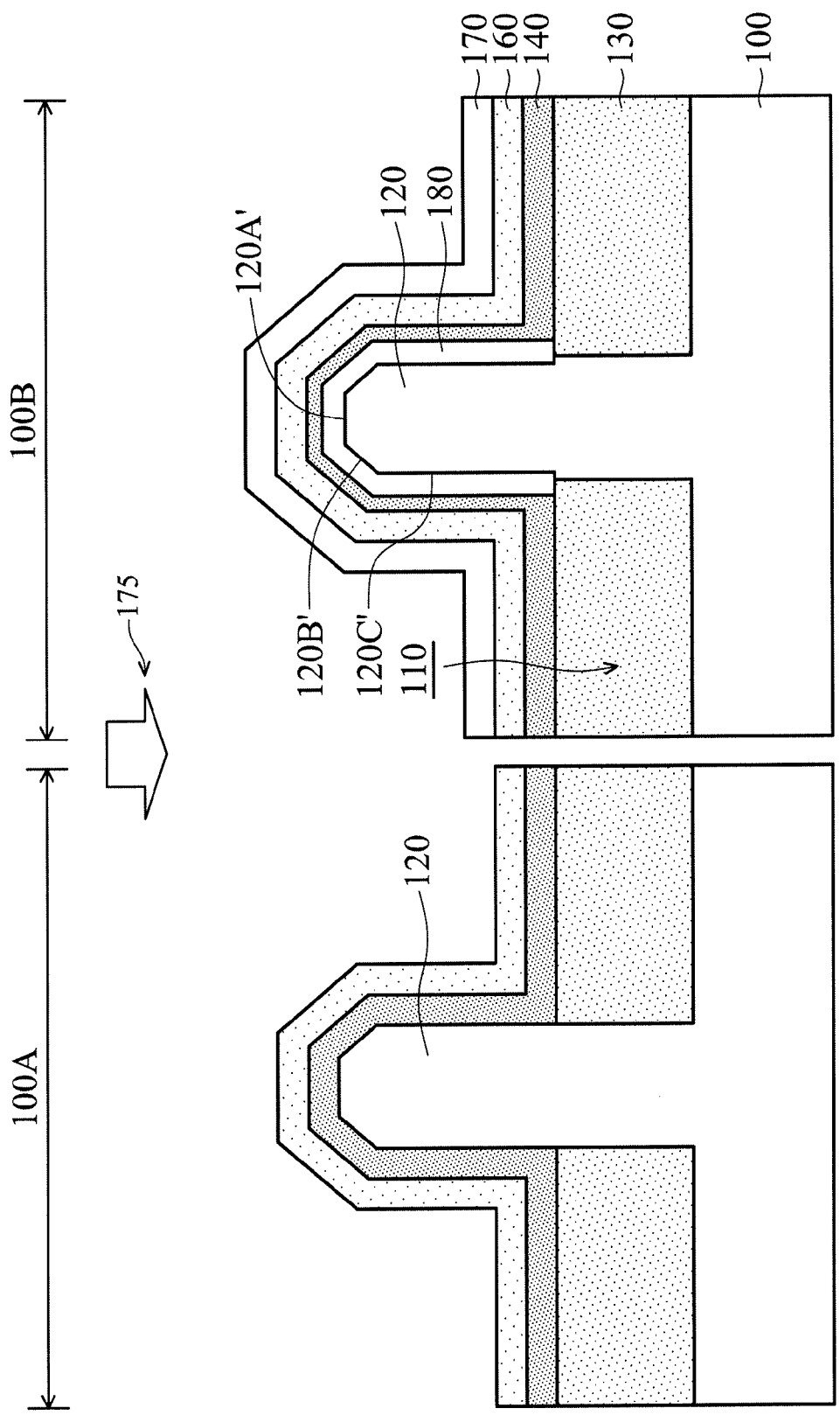

Many variations and/or modifications can be made to embodiments of the disclosure. For example, the semiconductor device structure is not limited to include fin structures made of the same material. In some other embodiments, the semiconductor device structure includes fin structures made of different materials. FIGS. 3A-3B are cross-sectional views of various stages of a process for forming a semiconductor device structure, in accordance with some embodiments.

As shown in FIG. 3A, a semiconductor device structure similar to that shown in FIG. 1D is provided, in accordance with some embodiments. The materials and/or formation methods of the semiconductor substrate 100, the fin structures 120, the isolation features 130, the interfacial layer 140, the oxygen scavenging layer 160, and the barrier layer 170 have been described and are not repeated.

The semiconductor substrate 100 is divided into multiple regions 100A and 100B. In some embodiments, N-type FinFETs or P-type FinFETs are configured to formed in the regions 100A and 100B. In some embodiments, an N-type FinFET is configured to formed in the regions 100A and a P-type FinFET is configured to formed in the regions 100B. In some embodiments, a P-type FinFET is configured to formed in the regions 100A and an N-type FinFET is configured to formed in the regions 100B.

In some embodiments, the fin structures 120 in the regions 100A are made of silicon. In some embodiments, the fin structures 120 in the regions 100B are made of a compound semiconductor containing silicon. In some other embodiments, the fin structures 120 in the regions 100B are made of an elementary semiconductor material that is not silicon or a compound semiconductor without silicon.

As shown in FIG. 3A, a patterned mask layer 190 is formed over the barrier layer 170, in accordance with some embodiments. In some embodiments, the patterned mask layer 190 covers the barrier layer 170 in the regions 100B while the barrier layer 170 in the regions 100A is exposed without being covered by the patterned mask layer 190.

In some embodiments, the patterned mask layer 190 includes a photoresist material and is formed using a photolithography process. The photolithography process may include a photoresist coating process (such as a spin-on coating process), a soft baking process, a mask aligning process, an exposure process, a post-exposure baking process, a developing process, a rinsing process, a drying process (such as a hard baking process), another suitable process, or a combination thereof.

As shown in FIG. 3B, the exposed portion of the barrier layer 170 is removed through openings defined by the patterned mask layer 190, in accordance with some embodiments. In some embodiments, an etching process is used to remove the exposed portion of the barrier layer 170. In some embodiments, the etching process includes a dry etching process, a wet etching process or another suitable etching process.

Afterwards, the patterned mask layer 190 is removed, and a thermal process 175 is performed over the semiconductor substrate 100, in accordance with some embodiments. As a result, a passivation layer 180 is formed over the fin structures 120 in the region 100B. The thermal process 175 and the materials and/or formation methods of the passivation layer 180 have been described and are not repeated.

As shown in FIG. 3B, the oxygen scavenging layer 160 in the regions 100A are exposed from the barrier layer 170 during the thermal process 175. In some embodiments, the oxygen scavenging layer 160 absorbs oxygen that is not from the interfacial layer 140. As a result, there is no passivation layer formed in the regions 100A.

In some embodiments, the size of the fin structures 120 is constant before and after the thermal process 175. In some embodiments, the size of the interfacial layer 140 in the regions 100A is constant before and after the thermal process 175. In some other embodiments, the upper portion of the fin structures 120 in the regions 100A is oxidized during the thermal process 175. As a result, the upper portion of the fin structures 120 in the regions 100A is retracted.

Embodiments of the disclosure can be applied to not only a semiconductor device structure with FinFETs but also a semiconductor device structure with planar FETs. In some embodiments, the materials and/or formation methods of a semiconductor device structure with planar FETs are similar to those of the described semiconductor device structure with FinFETs.

Embodiments of the disclosure form a semiconductor device structure with a passivation layer over a semiconductor substrate. The passivation layer made of silicon is formed during a thermal process, rather than being formed by an epitaxial growth process. The passivation layer has an improved uniformity (or a reduced ΔCET). As a result, coverage of the passivation layer over the semiconductor substrate (such as fin structures) is enhanced. Even if the surface of fin structures includes {111} crystal orientations, it is ensured that the passivation layer sufficiently covers the {111} surfaces. Furthermore, the passivation layer has a reduced thickness (or a reduced CET). As a result, driving current of the semiconductor device structure is increased and thereby mitigating a short channel effect. Therefore, the performance and reliability of the semiconductor device structure are greatly improved.

In accordance with some embodiments, a semiconductor device structure is provided. The semiconductor device structure includes a fin structure over a semiconductor substrate. The fin structure includes a lower portion and an upper portion. The upper portion includes a first surface and a second surface. The first surface is inclined to the second surface. The semiconductor device structure also includes an isolation feature surrounding the lower portion of the fin structure. The semiconductor device structure further includes a passivation layer covering the first surface and the second surface of the upper portion of the fin structure. The passivation layer includes a semiconductor material and has a substantially uniform thickness. In addition, the semiconductor device structure includes an interfacial layer over the passivation layer. The interfacial layer includes the semiconductor material. The interfacial layer has a first portion covering the fin structure and a second portion covering the isolation feature. The passivation layer separates the fin structure from the interfacial layer.

In accordance with some embodiments, a semiconductor device structure is provided. The semiconductor device structure includes a fin structure over a semiconductor substrate. An upper portion of the fin structure includes a first surface and a second surface. The first surface is inclined to the second surface. The semiconductor device structure also includes a passivation layer covering the first surface and the second surface of the fin structure. The passivation layer has a substantially uniform thickness. The semiconductor device structure further includes an isolation feature surrounding a lower portion of the fin structure. An interface between the isolation feature and the lower portion of the fin structure is non-coplanar with the first surface and the second surface of the fin structure. In addition, the semiconductor device structure includes a dielectric layer covering the passivation layer and the isolation feature.

In accordance with some embodiments, a method for forming a semiconductor device structure is provided. The method includes forming a fin structure over a semiconductor substrate. The fin structure includes a lower portion and an upper portion. The upper portion includes a first surface and a second surface which is inclined to the first surface. The method also includes forming an isolation feature surrounding the lower portion of the fin structure. The method further includes forming an interfacial layer including an oxide containing oxygen and a semiconductor material. The interfacial layer covers the fin structure and the isolation feature. In addition, the method includes forming an oxygen scavenging layer over the interfacial layer. The oxygen scavenging layer covers the fin structure and the isolation feature. The method also includes performing a thermal process such that the oxygen scavenging layer draws out the oxygen from a first portion of the interfacial layer adjoining the fin structure. The first portion of the interfacial layer is reduced to form a passivation layer including the semiconductor material during the thermal process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a fin structure over a semiconductor substrate, wherein the fin structure comprises a lower portion and an upper portion, and wherein the upper portion comprises a first surface and a second surface which is inclined to the first surface;
   an isolation feature surrounding the lower portion of the fin structure;
   a passivation layer covering the first surface and the second surface of the upper portion of the fin structure, wherein the passivation layer comprises a semiconductor material and has a substantially uniform thickness; and
   an interfacial layer over the passivation layer, wherein the interfacial layer comprises the semiconductor material, and the interfacial layer has a first portion covering the fin structure and a second portion covering the isolation feature, and wherein the passivation layer separates the fin structure from the interfacial layer.

2. The semiconductor device structure as claimed in claim 1, wherein a sum of a thickness of the first portion of the interfacial layer and the thickness of the passivation layer is substantially equal to a thickness of the second portion of the interfacial layer.

3. The semiconductor device structure as claimed in claim 1, wherein an interface between the isolation feature and the lower portion of the fin structure is non-coplanar with the second surface of the upper portion of the fin structure.

4. The semiconductor device structure as claimed in claim 1, wherein the passivation layer is in contact with the first surface and the second surface of the fin structure.

5. The semiconductor device structure as claimed in claim 1, wherein the interfacial layer adjoins the passivation layer and the isolation feature.

6. The semiconductor device structure as claimed in claim 1, wherein the passivation layer is substantially free of oxygen.

7. The semiconductor device structure as claimed in claim 1, further comprising a gate dielectric layer, wherein the first portion of the interfacial layer is between the passivation layer and the gate dielectric layer, and the second portion of the interfacial layer is between the isolation feature and the gate dielectric layer.

8. A semiconductor device structure, comprising:
a fin structure over a semiconductor substrate, wherein an upper portion of the fin structure comprises a first surface and a second surface which is inclined to the first surface;
a passivation layer covering the first surface and the second surface of the fin structure, wherein the passivation layer has a substantially uniform thickness;
an isolation feature surrounding a lower portion of the fin structure, wherein an interface between the isolation feature and the lower portion of the fin structure is non-coplanar with the first surface and the second surface of the fin structure; and
a dielectric layer covering the passivation layer and the isolation feature.

9. The semiconductor device structure as claimed in claim 8, further comprising an interfacial layer, wherein the interfacial layer has a first portion sandwiched between the passivation layer and the dielectric layer and a second portion sandwiched between the isolation feature and the dielectric layer.

10. The semiconductor device structure as claimed in claim 9, wherein a thickness of the first portion of the interfacial layer is less than a thickness of the second portion of the interfacial layer.

11. The semiconductor device structure as claimed in claim 9, wherein the interfacial layer comprises an oxide containing oxygen and a semiconductor material, and the passivation layer is made of the semiconductor material.

12. The semiconductor device structure as claimed in claim 8, wherein a distance between the upper portion of the fin structure and the dielectric layer is greater than a distance between the isolation feature and the dielectric layer.

13. The semiconductor device structure as claimed in claim 8, wherein a width of the upper portion of the fin structure is less than a width of the lower portion of the fin structure, and wherein the passivation layer adjoins the interface between the isolation feature and the lower portion of the fin structure.

14. The semiconductor device structure as claimed in claim 8, wherein the passivation layer surrounds the upper portion of the fin structure and is separated from the lower portion of the fin structure by the isolation feature.

15. A method for forming a semiconductor device structure, comprising:
forming a fin structure over a semiconductor substrate, wherein the fin structure comprises a lower portion and an upper portion, and wherein the upper portion comprises a first surface and a second surface which is inclined to the first surface;
forming an isolation feature surrounding the lower portion of the fin structure;
forming an interfacial layer comprising an oxide containing oxygen and a semiconductor material, wherein the interfacial layer covers the fin structure and the isolation feature;
forming an oxygen scavenging layer over the interfacial layer, wherein the oxygen scavenging layer covers the fin structure and the isolation feature; and
performing a thermal process such that the oxygen scavenging layer draws out the oxygen from a first portion of the interfacial layer adjoining the fin structure, wherein the first portion of the interfacial layer is reduced to form a passivation layer comprising the semiconductor material during the thermal process.

16. The method for forming a semiconductor device structure as claimed in claim 15, wherein the first portion of the interfacial layer becomes thinner during the thermal process, and wherein a second portion of the interfacial layer adjoining the isolation feature keeps substantially the same thickness during the thermal process.

17. The method for forming a semiconductor device structure as claimed in claim 15, wherein the upper portion of the fin structure becomes narrower and shorter during the thermal process.

18. The method for forming a semiconductor device structure as claimed in claim 15, further comprising:
forming a barrier layer covering the oxygen scavenging layer before the thermal process; and
removing the barrier layer to expose the oxygen scavenging layer after the thermal process.

19. The method for forming a semiconductor device structure as claimed in claim 18, further comprising:
forming a second fin structure over the semiconductor substrate before the formation of the interfacial layer, wherein the interfacial layer, the oxygen scavenging layer and the barrier layer further cover the second fin structure; and
etching the barrier layer such that the barrier layer covers the fin structure and exposes the second fin structure during the thermal process, wherein the interfacial layer is in contact with the second fin structure after the thermal process.

20. The method for forming a semiconductor device structure as claimed in claim 15, further comprising:
performing a surface treatment over the fin structure to form —H bonds on the first surface and the second surface of the upper portion of the fin structure before the formation of the interfacial layer; and
forming —OH bonds on the first surface and the second surface of the upper portion of the fin structure after the surface treatment and before the thermal process.

* * * * *